US012040307B2

(12) United States Patent
Eid et al.

(10) Patent No.: US 12,040,307 B2
(45) Date of Patent: Jul. 16, 2024

(54) MAGNETIC INDUCED HEATING FOR SOLDER INTERCONNECTS

(71) Applicant: Intel Corporation, Santa Clara, CA (US)

(72) Inventors: Feras Eid, Chandler, AZ (US); Adel Elsherbini, Tempe, AZ (US); Georgios Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 16/887,126

(22) Filed: May 29, 2020

(65) Prior Publication Data

US 2021/0375820 A1 Dec. 2, 2021

(51) Int. Cl.
*H01L 23/00* (2006.01)

(52) U.S. Cl.
CPC .............. *H01L 24/81* (2013.01); *H01L 24/03* (2013.01); *H01L 24/05* (2013.01); *H01L 24/13* (2013.01); *H01L 24/16* (2013.01); *H01L 2224/0401* (2013.01); *H01L 2224/16227* (2013.01); *H01L 2224/81222* (2013.01); *H01L 2224/81815* (2013.01)

(58) Field of Classification Search
CPC ......... H01L 24/81; H01L 24/03; H01L 24/05; H01L 24/13; H01L 24/16; H01L 2224/0401; H01L 2224/16227; H01L 2224/81222; H01L 2224/81815; H01L 2224/05599; H01L 2224/10152; H01L 2224/13111; H01L 2224/75253; H01L 2224/75264; H01L 2224/81001; H01L 2224/81192; H01L 2224/81399; H01L 2924/00014
See application file for complete search history.

(56) References Cited

U.S. PATENT DOCUMENTS

2011/0281375 A1* 11/2011 Swaminathan ......... H01L 24/13
257/E21.499

* cited by examiner

*Primary Examiner* — Douglas W Owens
(74) *Attorney, Agent, or Firm* — Essential Patents Group, LLP

(57) ABSTRACT

Magnetic structures incorporated into integrated circuit assemblies. In some examples, the magnetic structures may enable local heating and reflow of solder interconnects for the attachment of integrated circuit devices to electronic substrates.

16 Claims, 5 Drawing Sheets

MAGNETIC INDUCED HEATING FOR SOLDER INTERCONNECTS

TECHNICAL FIELD

Embodiments of the present description generally relate to the field of integrated circuit assemblies, and, more specifically, to forming magnetic structures adjacent solder interconnects used to electrically attach components, such as integrated circuit devices, electronic substrates, and the like.

BACKGROUND

The electronics industry is continually striving to produce ever faster, smaller, and thinner integrated circuit assemblies for use in various electronic products, including, but not limited to, computer server products and portable products, such as portable computers, electronic tablets, cellular phones, digital cameras, and the like. As these goals are achieved, the fabrication of the integrated circuit assemblies becomes more challenging.

Integrated circuit assemblies are generally fabricated with at least one integrated circuit component electrically attached to an electronic substrate (such as an interposer, a motherboard, or the like) through interconnects, such as solder features (e.g. solder balls or paste) extending therebetween in a configuration generally known as a flip-chip or controlled collapse chip connection ("C4") configuration. The attachment of the integrated circuit components to the electronic substrate is generally done in convection ovens. In these ovens, the integrated circuit components and the electronic substrate are heated to an elevated temperature for a sufficient time to melt and reflow all solder features, thereby forming permanent electrical connections therebetween.

Although the use of a convection oven has the advantage of high throughput (since all solder features are reflowed at the same time), it suffers from some disadvantages due to the need to raise the entire assembly temperature for an extended duration of time. One disadvantages may include undesirable warpage in the integrated circuit component and/or electronic substrate. As will be understood to those skilled in the art, the integrated circuit component may comprise a variety of elements, such as an interposer, dielectric build-up layers, metallization layers, mold materials, and at least one integrated circuit device, each of which may have differing coefficients of thermal expansion. The fundamental differences in the thermal expansion of these elements may result in temperature dependent deformation or warpage of the integrated circuit component, when the integrated circuit component is being attached to the electronic substrate, such as a motherboard. This warpage may cause significant issues, such as non-contact opens, between the integrated circuit component and the electronic substrate. A second disadvantage of using a convection oven is that the temperature required to reflow the solder features may induce blistering of some material, such as from outgassing of volatile organic compounds in dielectric layers within the integrated circuit components, which get heated unnecessarily in the oven. As will be understood to those skilled in the art, a further challenge is re-workability, i.e. the ability to redo a specific solder interconnect or small number of solder interconnects without affecting the other solder interconnects (sometimes thousands) between the integrated circuit component and the electronic substrate.

Current attempts to mitigate these issues have focused on trying to reduce the reflow temperature by introducing new solder formulations that melt at lower temperature than solders currently used. Even though lower reflow temperatures may help reduce warpage caused by differing coefficients of thermal expansion, and may reduce thermal degradation of some elements within the integrated circuit assembly, this solution does not eliminate those problems entirely. Moreover, for this approach to be successful, it requires all of the components, both active and passive, that are a part of the integrated circuit assembly to use low temperature solder materials, since all the components have to reflow at the same temperature, as will be understood to those skilled in the art. Additionally, the use of solders having low reflow temperatures does not address the issue of re-workability, as previously discussed.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
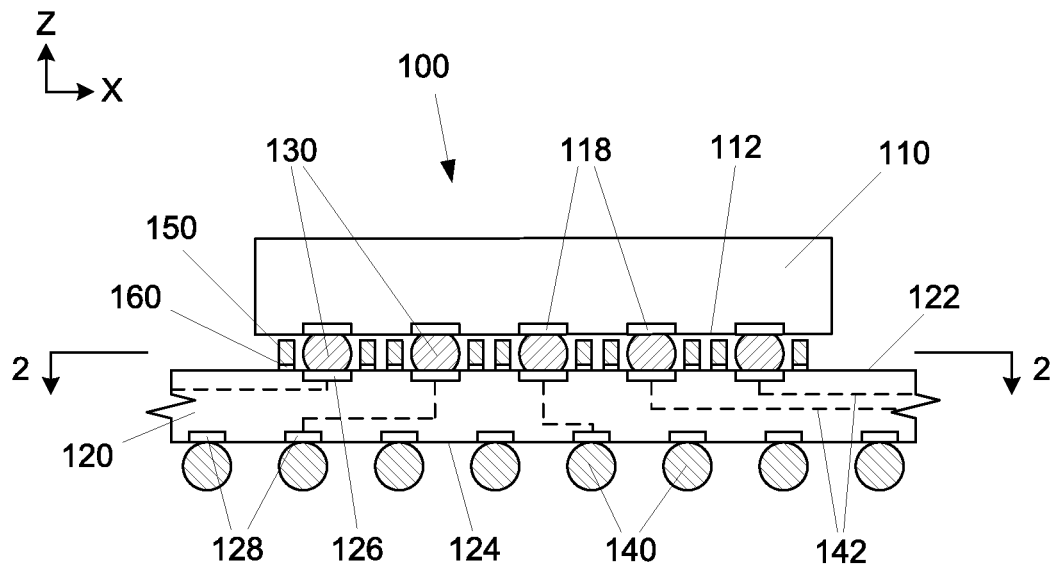
FIG. 1 is a side cross-sectional view of an electronic assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the incorporation of magnetic structures into integrated circuit assemblies that will enable local heating and reflow of solder interconnects for the attachment of integrated circuit devices to electronic substrates. Such magnetic structures will eliminate exposure of the entire integrated circuit assembly to elevated temperatures for an extended period of time, which eliminates associated warpage and thermal degradation consequences from such exposure. Additionally, such magnetic structures will allow for re-workability of specific solder interconnects.

FIG. 1 illustrates an integrated circuit assembly or package 100, according to one embodiment of the present description. The integrated circuit assembly 100 may comprise a first electronic substrate 110 electrically attached to a second electronic substrate 120 with a plurality of solder interconnects 130. Although the first electronic substrate 110 is illustrated as an integrated circuit device, and the second electronic substrate 120 is illustrated as an interposer, it is understood that the first electronic substrate 110 and the second electronic substrate 120 may be any appropriate electronic component, including, but not limited to integrated circuit devices (such as a microprocessor, a chipset, a graphics device, a wireless device, a memory device, an application specific integrated circuit, a transceiver device, an input/output device, combinations thereof, stacks thereof, or the like) and signal routing substrates (such as printed circuit boards, including interposers, motherboards, and the like).

As shown in FIG. 1, the solder interconnects 130 may extend between bond pads 118 on a first surface 112 of the first electronic substrate 110 and corresponding bond pads 126 on a first surface 122 of the second electronic substrate 120 in a configuration generally known as a flip-chip or controlled collapse chip connection ("C4") configuration. When the first electronic substrate 110 is an integrated circuit device, as shown, the bond pads 118 of the first electronic substrate 110 may be in electrical communication with integrated circuitry (not shown) within the first electronic substrate 110. When the second electronic substrate 120 is a signal routing substrate, the second electronic substrate 120 may comprise a plurality of dielectric layers (not shown) with a plurality of conductive routes 142 or "metallization" (shown as dashed lines) extending between and through the dielectric layers (not shown). The bond pads 126 of the second electronic substrate 120 may be in electrical communication with the conductive routes 142. As will be understood to those skilled in the art, the conductive routes 142 may be a combination of conductive traces (not shown) and conductive vias (not shown) extending through the plurality of dielectric material layers (not shown). The conductive routes 142 may provide electrical communication routes between the first electronic substrate 110 and/or to other electronic components (not shown), and/or may provide electrical communication routes to attachment bond pads 128 proximate a second surface 124 of the second electronic substrate 120 for attachment to an electronic board (not shown). External interconnects 140 may be attached to the attachment bond pads 128. As will be understood to those skilled in the art, the second electronic substrate 120 may reroute a fine pitch (center-to-center distance) of the solder interconnects 130 to a relatively wider pitch of the external interconnects 140.

The dielectric layers (not shown) of the second electronic substrate 120 may comprise any appropriate dielectric material, including, but not limited to, liquid crystal polymer, epoxy resin, bismaleimide triazine resin, FR4, polyimide materials, and the like. The conductive routes 142 may be formed of any appropriate conductive material, including, but not limited to, copper, silver, gold, nickel, and alloys thereof. It is understood that the second electronic substrate 120 may be formed from any number of dielectric layers and may contain active and/or passive microelectronic devices (not shown) formed therein. It is further understood that the conductive routes 142 could form any desired electrical route within the second electronic substrate 120 and/or with additional external components (not shown). It is also understood that solder resist layers (not shown) could be utilized on the first surface 122 of the second electronic substrate 120 and/or the second surface 124 of the second electronic substrate 120, as will be understood to those skilled in the art. The processes used for forming the second electronic package substrate 120 are well known to those skilled in the art, and for the sake of brevity and conciseness will not be described or illustrated herein.

The solder interconnects 130 can be made from any appropriate solder material, including, but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 2:
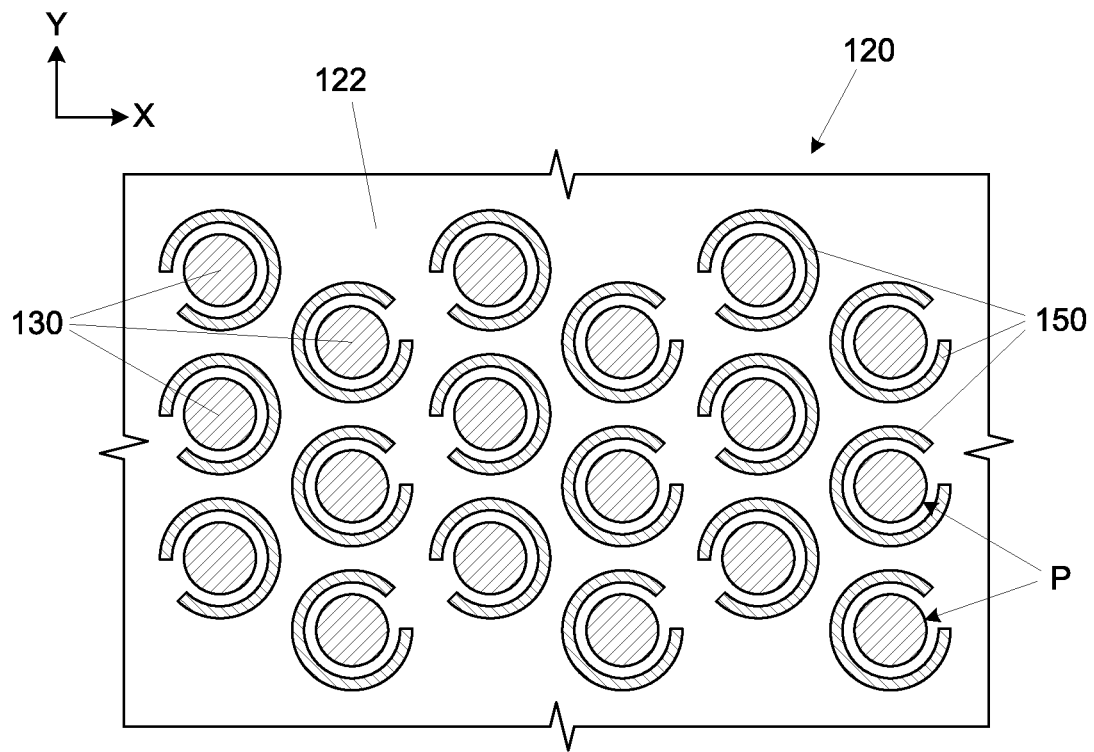
FIG. 2 is a plan view along line 2-2 of FIG. 1, according to one embodiment of the present description.

As shown in FIGS. 1 and 2, the second electronic substrate 120 may further include at least one magnetic structure 150. The magnetic structure(s) 150 may be attached to the first surface 122 of the second electronic substrate 120 and substantially surround a periphery P (see FIG. 2) of the at least one solder interconnect 130. For the purposes of the present description, the periphery P of the solder interconnect 130 may be defined to be the maximum circumference of the solder interconnect 130 in a plane parallel to a plane defined by the first surface 122 of the second electronic substrate 120, as will be understood to those skilled in the art. Furthermore, for the purposes of the present description, the term "substantially surround" is defined to mean that the magnetic structure 150 encircles at least 75% of the periphery P of the solder interconnect 130. It is noted that in FIG. 2, the magnetic structure(s) 150 does not entirely surround each solder interconnect 130. This is a result of the use of a stencil to form the magnetic structure(s) 150 and not a functional aspect of the magnetic structure(s) 150. It is understood that the at least one magnetic structure 150 may entirely encircle its respective solder interconnect 130. Furthermore, it is understood that the at least one magnetic structure 150 need not be circular, but may be any shape or configuration to effectuate the embodiments of the present description.

In an embodiment of the present description, the magnetic structure 150 may comprise a magnetic material, including, but not limited to, iron, cobalt, nickel, or alloys thereof. In further embodiments of the present description, the magnetic material of the magnetic structure 150 may be alloyed with neodymium and/or samarium.

The magnetic structure 150 may be formed by any process known in the art, such as high throughput additive manufacturing ("HTAM"). In one embodiment, the magnetic structure 150 may be formed with a "coldspray" HTAM process. As the coldspray process is known in the art, it will not be illustrated, but rather merely discussed herein. With a coldspray process, solid powders of a desired material or materials to be deposited are accelerated in a carrier jet (e.g. compressed air or nitrogen) by passing the jet through a converging diverging nozzle. The jet exits the nozzle at a high velocity and reaches the underlying substrate (e.g. second electronic substrate 120), where the impact causes the solid particles in the jet to plastically deform and bond to the substrate. Subsequent layers of the material similarly adhere to each underlying layer upon continued jet impact, producing fast buildup (e.g. layers that are a few hundred microns thick can be deposited over an area of about 100-1000 $mm^2$ in a few seconds). Moreover, unlike thermal spraying techniques, this approach does not require melting the particles, thus protecting both the powders and the substrate from experiencing excessive processing temperatures. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art. Moreover, different materials can be combined in the feed powder and used to create hybrid features in one step.

As the dielectric materials (not specifically shown) of the second electronic substrate 120, particularly organic dielectric materials, may be relatively soft, the coldspray process may ablate the second electronic substrate 120. Thus, a base layer 160 may be formed on the second electronic substrate 120 prior to forming the magnetic structures 150. The base layer 160 may be formed from any appropriate material, including, but not limited to, metal, such as copper. The base layer 160 may be formed by any known technique including sputtering or plating, and may be relatively thin depending on the material used. In one embodiment, the base layer 160 may be between about 1 and 5 microns. In another embodiment, the base layer 160 may be less than about 1 micron.

Figure 3:
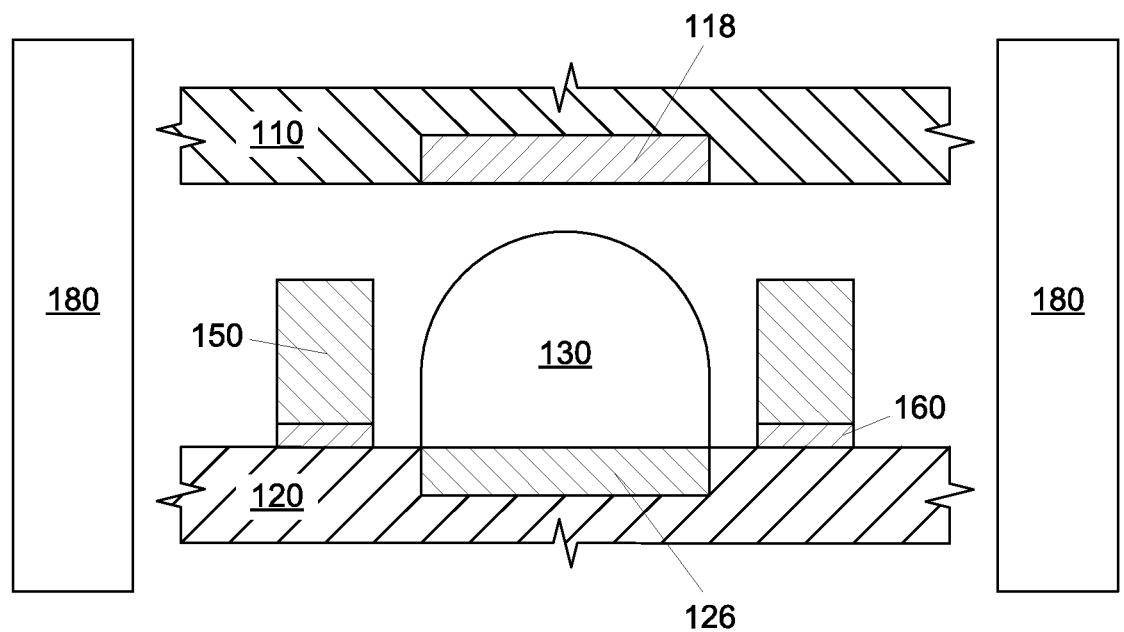
FIGS. 3 and 4 are side cross-sectional views of a process for electrically attaching electronic substrates using magnetic structures, according to an embodiment of the present description.

In order to electrically attach the first electronic substrate 110 and the second electronic substrate 120, a magnetic field generator 180 and the first electronic substrate 110 may be placed proximate the second electronic substrate 120, as shown in FIG. 3. In the presence of alternating current magnetic fields generated by the magnetic field generator 180, the magnetic material of the magnetic structure 150 will generate heat by relaxational and hysteretic loss modes. Relaxational losses occur in single domain magnetic particles and they release heat when the magnetic moment of the particle rotates with the applied magnetic field (Neel motion) and when the particle itself rotates due to Brownian motion. Hysteretic losses occur in multi-domain particles, and generate heat due to the various magnetic moments (due to multi-domains) rotating against the applied magnetic field. These losses occur with every cycle in the alternating current field, and the net heat generated increases with increasing number of field cycles. The various factors controlling heating rates may include, but are not necessarily limited to, magnetic particle size and size distribution, magnetic particle volume fractions (heat generation scales substantially linearly with volume fraction), magnetic material choice, shape anisotropy of the magnetic particles, and the applied frequency and amplitude of the alternating current used in the magnetic field generator 180. Therefore, when an alternating current magnetic field is applied by the magnetic field generator 180, the magnetic material within the magnetic structures 150 essentially vibrates and heats up to at least the reflow temperature of the solder interconnect 130.

Figure 4:
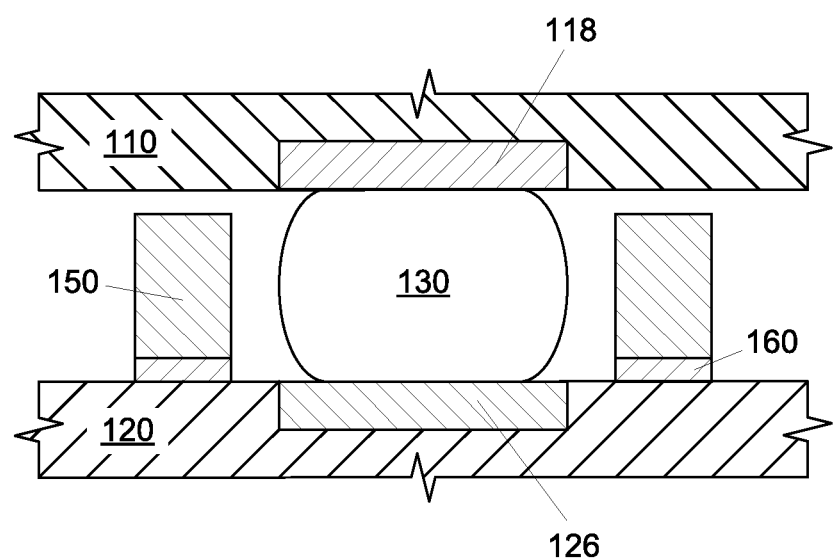

The bond pad 118 of the first electronic substrate 110 may be brought into contact with its respective, reflowed solder interconnect 130. The magnetic field generator 180 may then be deactivated, or the first electronic substrate 110 and the second electronic substrate 120 may be removed from the magnetic field, which allows the solder interconnects 130 to cool and re-solidify to form an interconnection between the first electronic substrate 110 and the second electronic substrate 120, as shown in FIG. 4.

Since heating the solder interconnect 130 to a reflow temperature during attachment of the first microelectronic substrate 110 and the second microelectronic substrate 120 is localized to the magnetic structures 150, other components (dielectric material layers, metallization, and the like) in the substrates 110 and 120 are only minimally heated up relative to external heating techniques. Thus, the magnetic heating of the present disclosure may minimize stresses due to thermal expansion mismatch. Furthermore, the magnetic field generator 180 may be designed and/or positioned to target a specific solder interconnect or a group of solder interconnects 130, which will allow for re-working improperly attached solder interconnects 130, as will be understood to those skilled in the art.

Figure 5:
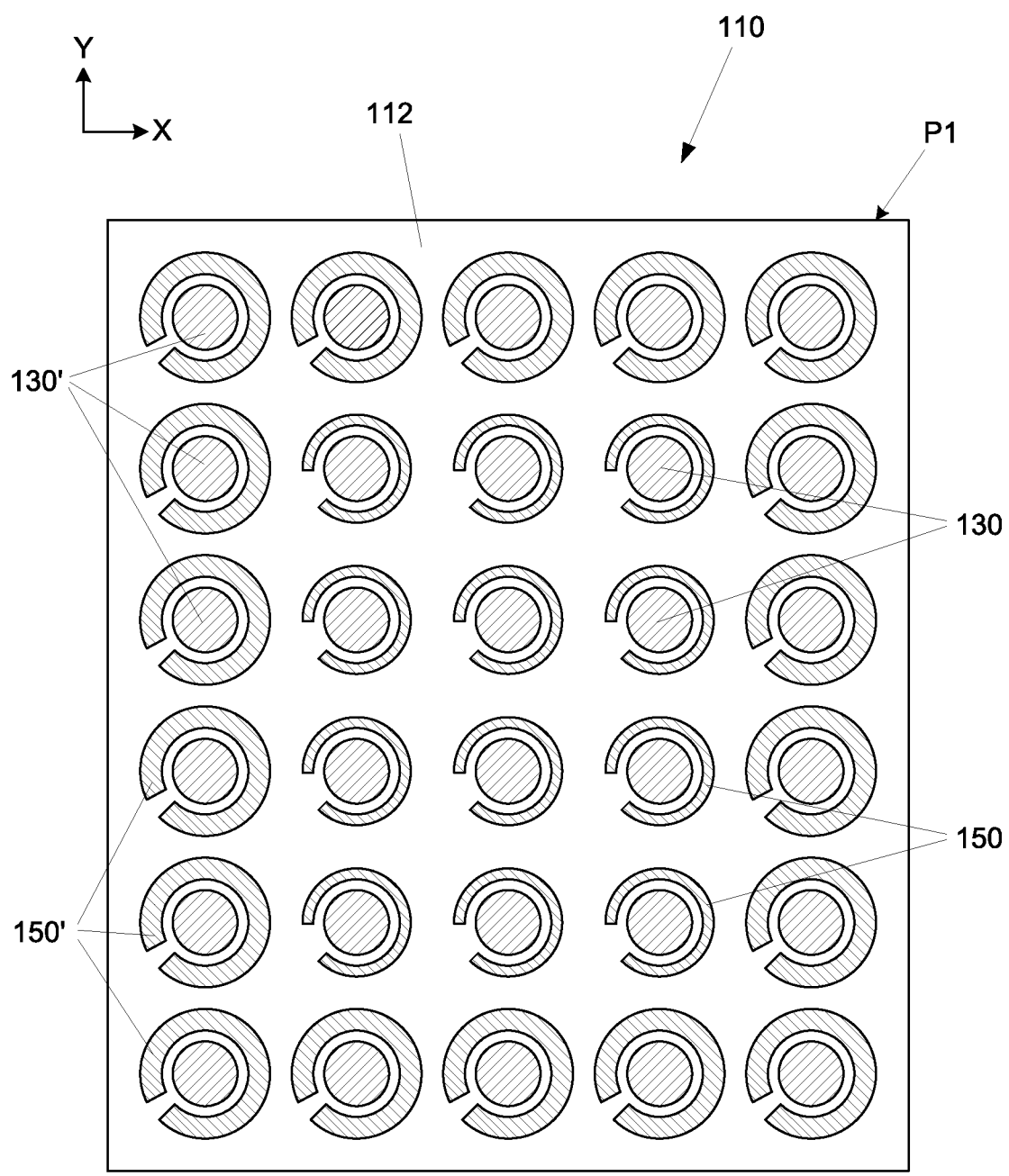
FIG. 5 is a plan view of an electronic substrate, according to another embodiment of the present description.

Although the magnetic structures 150 are all similar in FIGS. 1 and 2, it is understood that the coldspray process can be used to formed magnetic structures 150 that differ in the x, y, and/or z dimensions and sizes in different locations. For example, in FIG. 5, the magnetic structures 150 may be formed on the first substrate 110 and include magnetic structures 150' that are larger near a periphery P1 of the first electronic substrate 110 than the remaining magnetic structures 150. Such a configuration will induce melting and reflow of peripheral solder interconnects 130' first (e.g. prior to the reflow of the remaining solder interconnects 130), when subjected to a global alternating magnetic field, as previously discussed. When solder interconnect attachment is effectuated by simultaneously heating them to their reflow temperature, warpage is typically most significant near the periphery P1 and may in many cases lead to "no joint" formation in those regions due to lack of contact between the peripheral solder interconnects 130' on the warped first electronic substrate 110 and the corresponding bond pads 126 on the second electronic substrate 120 (see FIG. 1). By ensuring that the peripheral solder interconnects 130' melt and form joints first, this problem can be mitigated.

Figure 6:
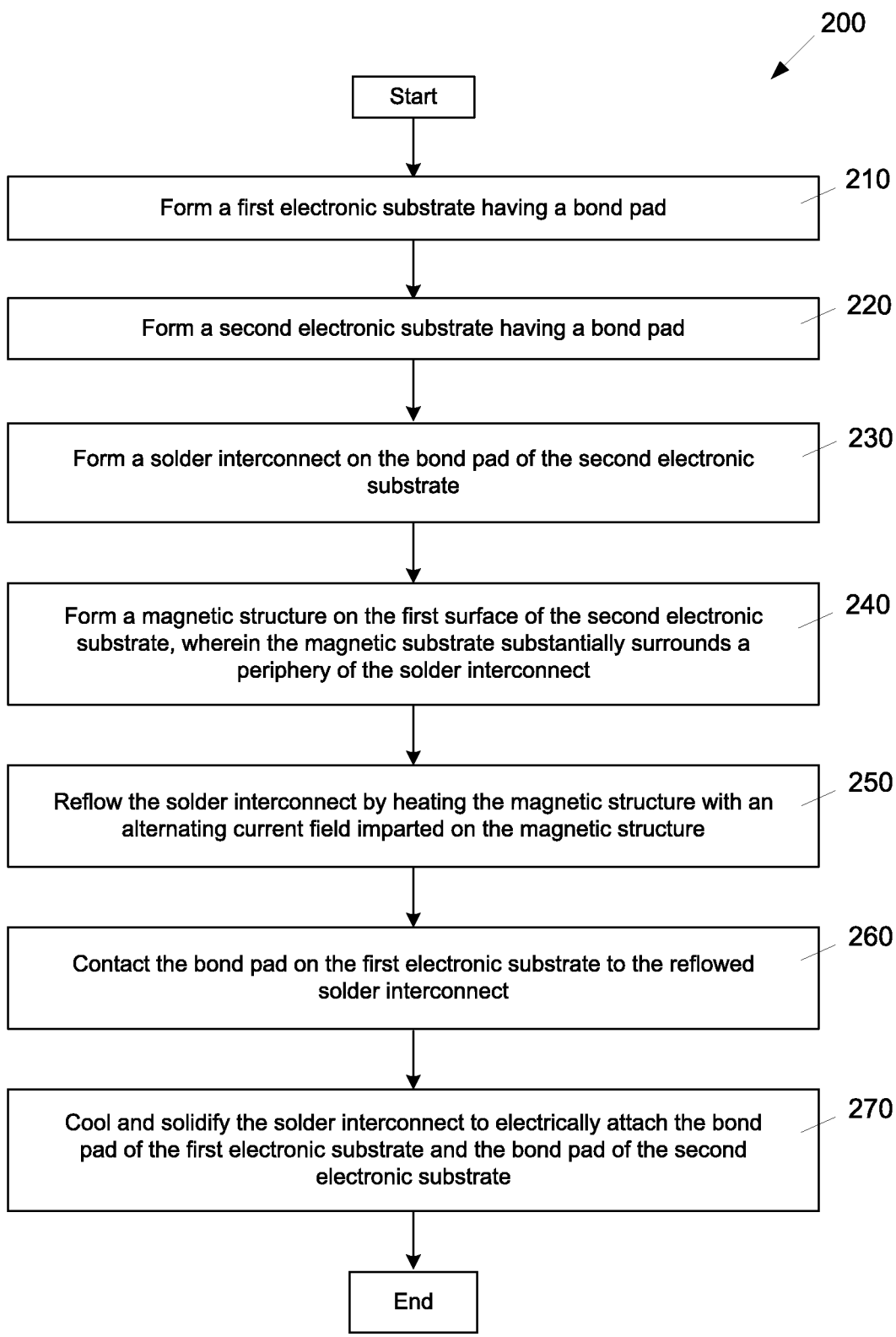
FIG. 6 is a flow chart of a process of fabricating a conductive route for an electronic substrate, according to an embodiment of the present description.

FIG. 6 is a flow chart of a process 200 of fabricating an electronic structure according to an embodiment of the present description. As set forth in block 210, a first electronic substrate having a bond pad may be formed. A second electronic substrate having a bond pad may be formed, as set forth in block 220. As set forth in block 230, a solder interconnect may be formed on the bond pad of the second electronic substrate. A magnetic structure may be formed on the second electronic substrate, wherein the magnetic structure substantially surrounds a periphery of the solder interconnect, as set forth in block 240. The solder interconnect may be reflowed by heating the magnetic structure with an alternating current magnetic field imparted on the magnetic structure, as set forth in block 250. As set forth in block 260, the bond pad on the first electronic substrate may be brought into contact with the reflowed solder interconnect. The solder interconnect may be cooled and solidified to electrically attach the bond pad of the first electronic substrate to the bond pad of the second electronic substrate, as set forth in block 270.

Figure 7:
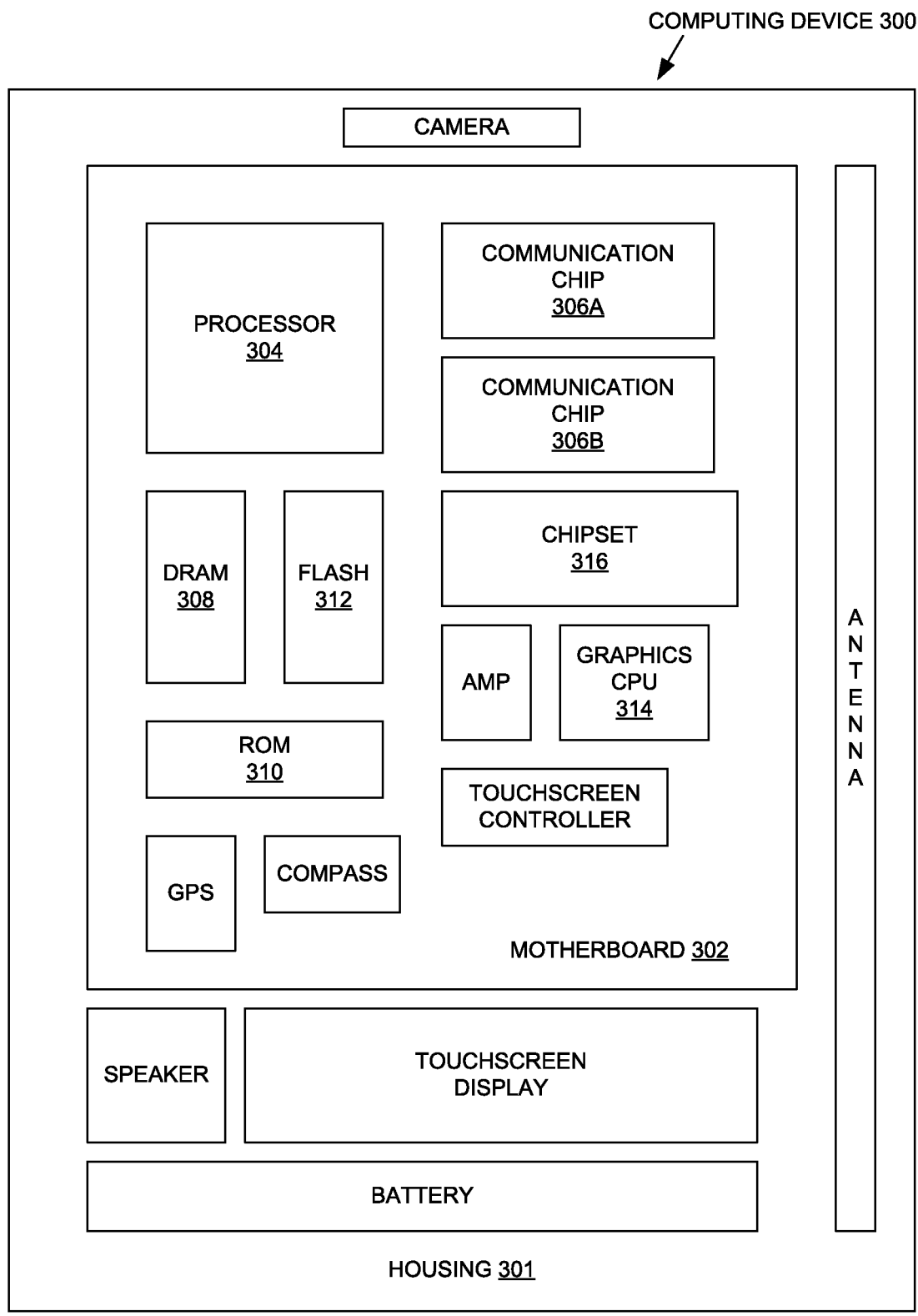
FIG. 7 is an electronic system, according to one embodiment of the present description.

FIG. 7 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may be electrically attached to the electronic board 302 with at least one solder interconnect, wherein a periphery of the at least one solder interconnect is substantially surrounded by a magnetic structure attached to either the electronic board or the integrated circuit component.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-7. The subject matter may be applied to other solder attachment processes in the fabrication of assemblies. Furthermore, the subject matter may also be used in any appropriate solder attachment application outside of the electronic device fabrication field.

The following examples pertain to further embodiments and specifics in the examples may be used anywhere in one or more embodiments, wherein Example 1 is an electronic assembly, comprising an electronic substrate; a bond pad in or on the electronic substrate; a solder interconnect on the at least one bond pad; and a magnetic structure on the electronic substrate and substantially surrounding a periphery of the solder interconnect.

In Example 2, the subject matter of Example 1 can optionally include the magnetic structure comprising iron, cobalt, nickel, and alloys thereof.

In Example 3, the subject matter of any of Examples 1 to 2 can optionally include a base layer between the electronic substrate and the magnetic structure.

In Example 4, the subject matter of Example 3 can optionally include the base layer comprising a metal layer.

In Example 5, the subject matter of any of Examples 1 to 4 can optionally include the electronic substrate comprising an integrated circuit device.

In Example 6, the subject matter of any of Examples 1 to 4 can optionally include the electronic substrate comprising a signal routing substrate.

Example 7 is an electronic package, comprising a first electronic substrate; a bond pad in or on the electronic substrate; a solder interconnect on the at least one bond pad; and a magnetic structure on the electronic substrate and substantially surrounding a periphery of the solder interconnect.

In Example 8, the subject matter of Example 7 can optionally include the magnetic structure comprising iron, cobalt, nickel, and alloys thereof.

In Example 9, the subject matter of any of Examples 7 to 8 can optionally include a base layer between a first surface of the first electronic substrate and the magnetic structure.

In Example 10, the subject matter of Example 9 can optionally include the base layer comprising a metal layer.

In Example 11, the subject matter of any of Examples 7 to 10 can optionally include the electronic substrate comprising an integrated circuit device.

In Example 12, the subject matter of any of Examples 7 to 10 can optionally include the first electronic substrate comprising a signal routing substrate.

Example 13 is an electronic system, comprising an electronic board and an integrated circuit component electrically attached to the electronic board with at least one solder interconnect, wherein a periphery of the solder interconnect is substantially surrounded by a magnetic structure attached to either the electronic board or the integrated circuit component.

In Example 14, the subject matter of Example 13 can optionally include the magnetic structure comprises iron, cobalt, nickel, and alloys thereof.

In Example 15, the subject matter of any of Examples 13 to 14 can optionally include a base layer between the magnetic structure an either the electronic board and the integrated circuit component.

In Example 16, the subject matter of Example 15 can optionally include the base layer comprising a metal layer.

Example 17 is a method of fabricating a conductive route comprising forming a first electronic substrate having a bond pad; forming a second electronic substrate having a bond pad; forming a solder interconnect on the bond pad of the second electronic substrate; forming a magnetic structure on the second electronic substrate, wherein the magnetic structure substantially surrounds a periphery of the solder interconnect; reflowing the solder interconnect by heating the magnetic structure with an alternating current magnetic field imparted on the magnetic structure; contacting the bond pad on the first electronic substrate to the reflowed solder interconnect; and cooling and solidifying the solder interconnect to electrically attach the bond pad of the first electronic substrate to the bond pad of the second electronic substrate.

In Example 18, the subject matter of Example 17 can optionally include the magnetic structure comprises iron, cobalt, nickel, and alloys thereof.

In Example 19, the subject matter of any of Examples 17 to 18 can optionally include a base layer between the first surface and the magnetic structure.

In Example 20, the subject matter of Example 19 can optionally include the base layer comprising a metal layer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic assembly, comprising:
   an electronic substrate;
   a plurality of bond pads in or on the electronic substrate;
   a plurality of solder interconnects, wherein individual ones of the solder interconnects are on individual ones of the bond pads; and
   a plurality of magnetic structures on the electronic substrate, wherein individual ones of the magnetic structures substantially surround corresponding individual ones of the solder interconnects.

2. The electronic assembly of claim 1, wherein individual ones of the magnetic structures comprise iron, cobalt, or nickel.

3. The electronic assembly of claim 1, further comprising a base layer between the electronic substrate and individual ones of the magnetic structures.

4. The electronic assembly of claim 3, wherein the base layer comprises a metal layer.

5. The electronic assembly of claim 1, wherein individual ones of the magnetic structures comprise a ring of magnetic material encircling at least 75% of a periphery of an individual one of the solder interconnects.

6. The electronic assembly of claim 1, wherein the electronic substrate comprises a signal routing substrate.

7. An electronic package, comprising:
   a first electronic substrate having a plurality of bond pads;
   a second electronic substrate having a plurality of bond pads;
   a plurality of solder interconnects, individual ones of the solder interconnects electrically attached to corresponding individual ones of the bond pads of the first electronic substrate and to corresponding individual ones of the bond pads of the second electronic substrate; and
   a plurality of magnetic structures on the first electronic substrate, wherein individual ones of the magnetic structures have an annular shape that substantially surrounds a periphery of individual ones of the solder interconnects.

8. The electronic package of claim 7, wherein the magnetic structures comprise iron, cobalt, or nickel.

9. The electronic package of claim 7, further comprising a base layer between a first surface of the first electronic substrate and the magnetic structures, wherein the base layer comprises a metal layer.

10. The electronic package of claim 9, wherein individual ones of the magnetic structures have thickness significantly greater than that of the base layer.

11. The electronic package of claim 7, wherein individual ones of the magnetic structures at least partially surround an individual one of the bond pads.

12. The electronic package of claim 7, wherein the first electronic substrate comprises a signal routing substrate.

13. An electronic system, comprising:
    an electronic board; and
    an integrated circuit component electrically attached to the electronic board with a plurality of solder interconnects, wherein a periphery of individual ones of the solder interconnects are substantially surrounded by a corresponding individual one of a plurality of magnetic structures.

14. The electronic system of claim 13, wherein the magnetic structures comprise iron, cobalt, or nickel.

15. The electronic system of claim 13, further comprising a base layer between the magnetic structures and either the electronic board or the integrated circuit component.

16. The electronic system of claim 15, wherein the base layer comprises a metal layer.

* * * * *